(12) United States Patent  
Bruno

(10) Patent No.: US 7,230,414 B2  
(45) Date of Patent: Jun. 12, 2007

(54) CURRENT SENSOR THAT INCLUDES A PAIR OF SEGMENTS

(75) Inventor: David A. Bruno, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 11/026,929

(22) Filed: Dec. 29, 2004

(65) Prior Publication Data

US 2006/0087777 A1    Apr. 27, 2006

Related U.S. Application Data

(60) Provisional application No. 60/621,172, filed on Oct. 21, 2004.

(51) Int. Cl.  
*G01R 15/18* (2006.01)

(52) U.S. Cl. .................................. 324/127; 324/117 R
(58) Field of Classification Search .................... None  
See application file for complete search history.

(56) References Cited

U.S. PATENT DOCUMENTS 3,374,434 A * 3/1968 Perry ........................ 324/127  
3,512,045 A * 5/1970 Sanger et al. ................ 361/44  
6,591,482 B1 * 7/2003 Fleege et al. ................ 29/605

* cited by examiner

*Primary Examiner*—Ha Tran Nguyen  
*Assistant Examiner*—Russell M. Kobert  
(74) *Attorney, Agent, or Firm*—Chernoff, Vilhauer, McClung & Stenzel

(57) ABSTRACT

A current sensor that includes a pair of segments. Each of the segments includes magnetically permeable cores that can be joined together. A winding is used to substantially encircle one of the cores.

8 Claims, 9 Drawing Sheets

CURRENT SENSOR THAT INCLUDES A PAIR OF SEGMENTS

CROSS-REFERENCE TO RELATED APPLICATIONS

This application claims the benefit of U.S. Patent Application Ser. No. 60/621,172 filed Oct. 21, 2004.

STATEMENT REGARDING FEDERALLY SPONSORED RESEARCH OR DEVELOPMENT

Not applicable.

BACKGROUND OF THE INVENTION

The present invention relates to a power monitoring system and, in particular, to an improved sensor for a power monitoring system.

Referring to FIG. 1, many electrical power distribution systems include a electrical panel enclosure 10 into which electric power is routed using one or more sets of wires 12. The electric power may have any voltage, any current, and any number of phases (e.g., single phase, two phases, or three phases). Each phase of the electric power is normally provided to a separate bus bar 14a, 14b, 14c which is normally an elongate conductor within the electrical panel enclosure 10. A plurality of circuit breakers 16a, 16b, 16c, etc. and branch circuit wiring electrically interconnect one or more of the bus bars 14a, 14b, and 14c to respective loads 18 that are typically located external to the panel enclosure 10. The circuit breakers 16 which are electrically connected to the bus bars 14a, 14b, 14c are commonly arranged in one or more vertically aligned rows 20 and 22 within the panel enclosure 10. Branch circuit wiring connects the circuit breaker 16 to the load 18 which commonly comprises a group of electrical loads, such as motors, lighting, heating units, cooling units, machinery, etc. The load may utilize single phase or multi-phase power. In the case of a three-phase load 18b, three wires will be used to connect a load to one or more circuit breakers. When the load 18 connected to a circuit breaker 16, shorts or otherwise draws excessive current, the circuit breaker 16 trips or otherwise disconnects the power to the load 18 to protect the wiring and the facility.

The total power usage by a facility may be readily obtained by reading the power meter provided by the power utility. The power meter is normally electrically interconnected between the electrical panel and the utility's distribution transformer. However, in many circumstances, it is desirable to monitor the power consumption of individual loads or groups of loads within a facility. Monitoring the power in a branch circuit permits effective sub-metering of different loads, buildings, or groups of loads to attribute the power usage to consumers obtaining power through the electrical distribution system. For example, power sub-metering may be used to attribute the power costs charged by the utility to different buildings, departments, or cost centers.

The traditional approach to monitoring such power usage is to install a power meter at a location proximate the load itself. To install a typical power meter on a three phase load, a current sensor is installed around each of the three wires that are connected to the load and a voltage connection is electrically interconnected to each wire. Such a power meter is available from Veris Industries, LLC under the name H8035 Power Meter. Unfortunately, it is burdensome to interconnect a significant number of power meters and in particular to make the voltage connections to the wires, especially if interconnections to the wires are not readily available. In addition, it is burdensome to interconnect the output of the power meters, if any, to a computer network because of the need to provide communication wiring or a wireless communication channel to each of the remotely located power meters. Also, installing the power meters requires significant expense for the technician to find a suitable location for the meter near each device to be monitored, in addition to the further expense of servicing the installed power meters.

Bowman et al., United States Patent Application Publication, Pub. No.: US 2003/0184280, incorporated herein by reference, disclose a branch circuit power monitoring system that can be mounted in or convenient to an electrical panel enclosure. The power monitoring system comprises a plurality of sensors connected to a power monitor that measures the voltage and phase angle at the bus bars in the electrical panel and the current in the various branch circuit wires connected to the circuit breakers. Power consumed by the load(s) attached to a branch circuit is calculated by the power monitor from the product of the current, the power factor, and the voltage.

The typical current sensor comprises a toroidal core having wire wound around the cross-section of the core over an arc of the torus. The branch circuit wiring connecting a circuit breaker to its respective load is routed through the aperture in the toroidal core of the current sensor. A varying current in the wire induces a current in the wire winding of the sensor that may be used directly or converted to a signal, for example, a voltage signal, from which the power monitor can determine the magnitude of the current flowing in the wire passing through the aperture in the sensor.

The current sensors can be individual units which are independently wired to the power monitor or individually addressable and daisy chained together to reduce the number of wires required to connect the current sensors to the power monitor. An industrial electrical panel may include eighty or more circuit breakers and a current sensor is required for each branch circuit that is to be monitored. Space is limited in an electrical panel enclosure and the circuit breakers and branch circuit wiring are closely spaced leaving little room for a large number of current sensors and the wiring necessary to connect them to a power monitor.

A plurality of current sensors can be spaced apart on a support that is easily mounted on the panel adjacent to a row of circuit breakers. Preferably, the current sensors are spatially arranged on the support so that the respective apertures in the bodies of the sensors are substantially aligned with the spaced apart connections of the branch circuit wiring to the respective circuit breakers. The sensor outputs can be conducted to the power monitor over a multi-conductor cable substantially reducing the amount of wiring necessary in the panel enclosure. However, if the electrical panel has already been wired, the branch wiring to each of the circuit breakers must be disconnected so that the sensor array can be installed in the panel enclosure and the branch circuit wires can be routed through the central apertures in the current sensors and then reconnected, increasing the time and expense of installing a branch power monitor.

What is desired, therefore, is a sensor for a power monitoring system that can be conveniently installed in a pre-wired panel enclosure.

DETAILED DESCRIPTION OF THE INVENTION

Figure 1:
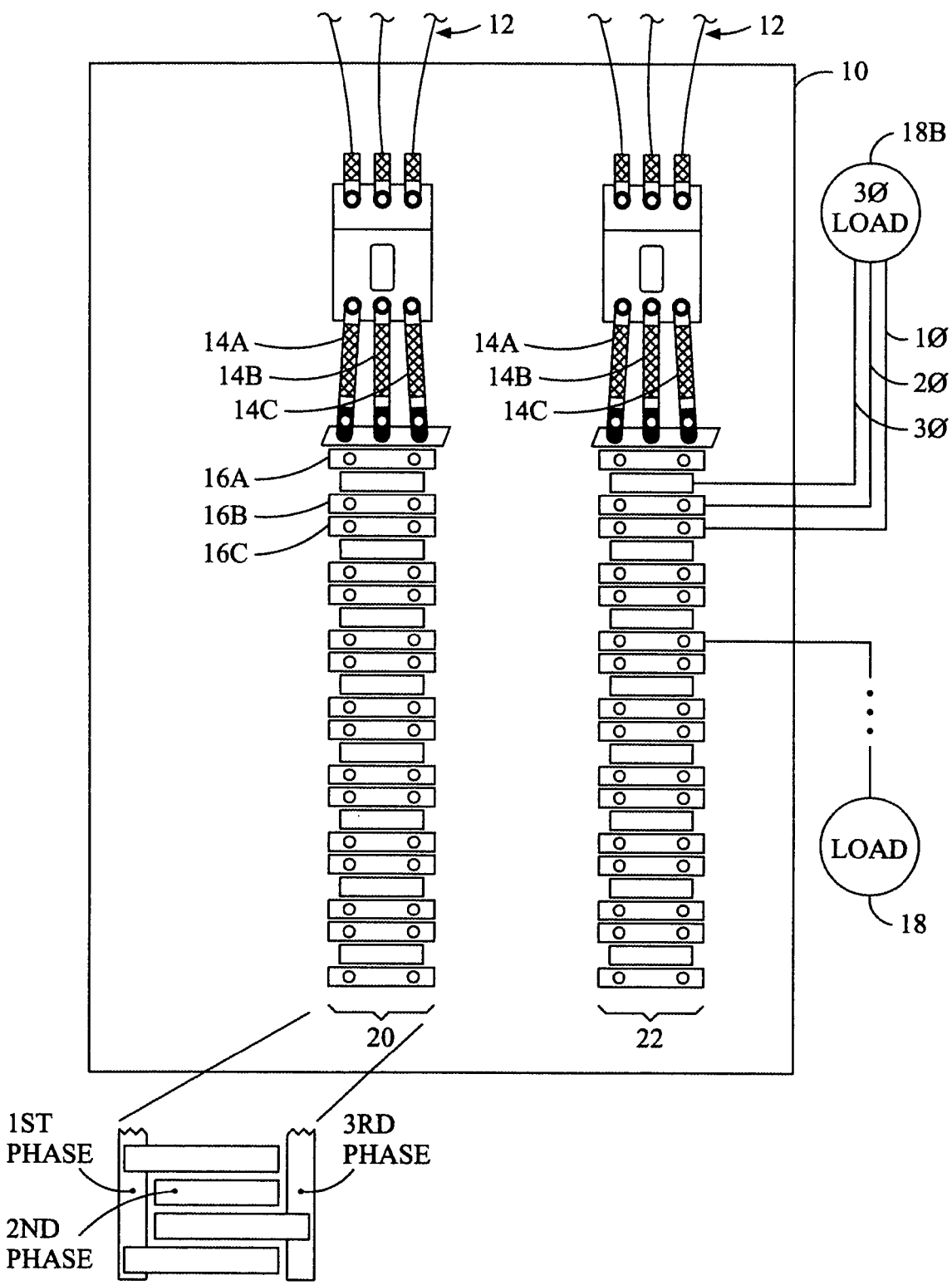
FIG. 1 illustrates a power panel with circuit breakers.
Figure 2:
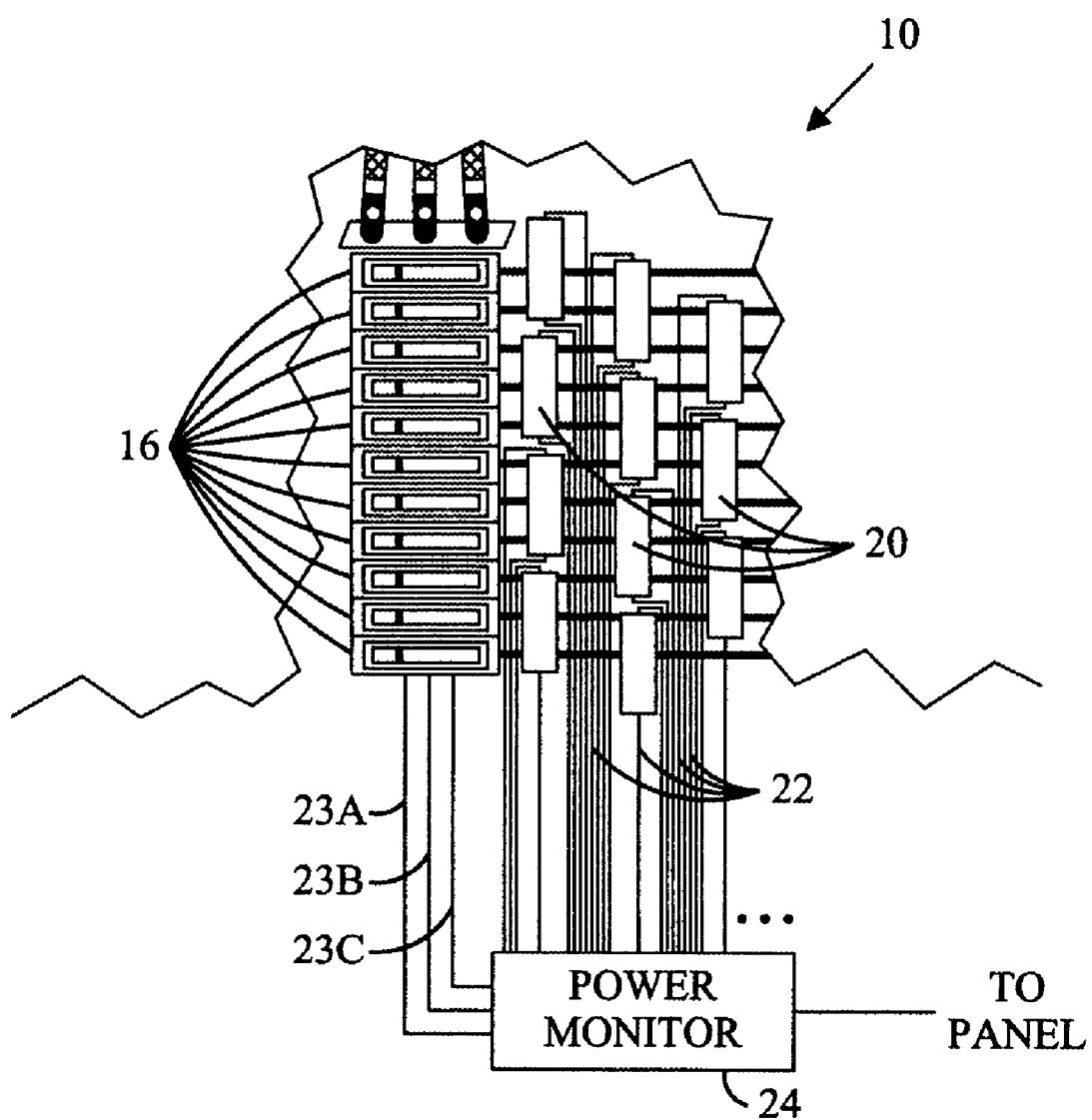
FIG. 2 illustrates circuit breakers, a power monitor, and associated sensors.

Referring in detail to the drawings where similar parts of the invention are identified by like reference numerals, and more particularly to FIG. 2, to monitor the power provided to a particular electrical load or group of loads from one or more individual circuit breakers 16, a current sensor 20 may be installed on the branch circuit wiring 63 connected to the load side of the respective circuit breaker. The branch circuit wiring comprises electrical conductors connecting a load to one or more circuit breakers that are connected to a source of single phase, two phase, or three phase power. The output 22 of each of the current sensors 20 may be interconnected to a power monitor 24 or a plurality of similar power monitors. The current sensors 20 may be directly connected to the power monitor, as illustrated; daisy chained together and individually addressable by the power monitor; or interconnected to the power monitor(s) in any other suitable manner. An electrical interconnection 23a, 23b, 23c from each bus bar to the power monitor(s) enables sensing of the voltage and its corresponding phase relationship. Alternatively, the voltage potential and phase relationship for each phase may be sensed from locations other than the bus bars 14a, 14b, and 14c, such as for example, a wire connected to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the corresponding voltage, current, and power factor which relates to the phase relationship between the voltage and current.

It takes considerable time and, therefore, entails significant expense to install, all of the individual current sensors 20 and the available space within the electrical panel enclosure 10 may be insufficient for the desired number of current sensors. The limited space available proximate the circuit breakers 16 may result in significant difficulty when installing the current sensors 20, thus requiring lateral spacing of the current sensors and bending of the wires from the circuit breakers to different locations within the power panel 10 to obtain sufficient available space for the current sensors 20. In addition, the large number of wires 22 from the current sensors 20 to the power monitor 24 may require considerable space within the electrical panel 10 and produces a significant tendency to improperly connect the wires 22 to the power monitor 24 and, in particular, to mismatch pairs of wires 22 from the same current sensor 20 rendering the current sensors 20 ineffective. Moreover, it is problematic to ensure that the wires 22, indicated by the installer as relating to a particular current sensor 20, actually are connected to the desired current sensor. In summary, the potential installation problems are significant and can result in substantial troubleshooting and commissioning costs.

Figure 3:
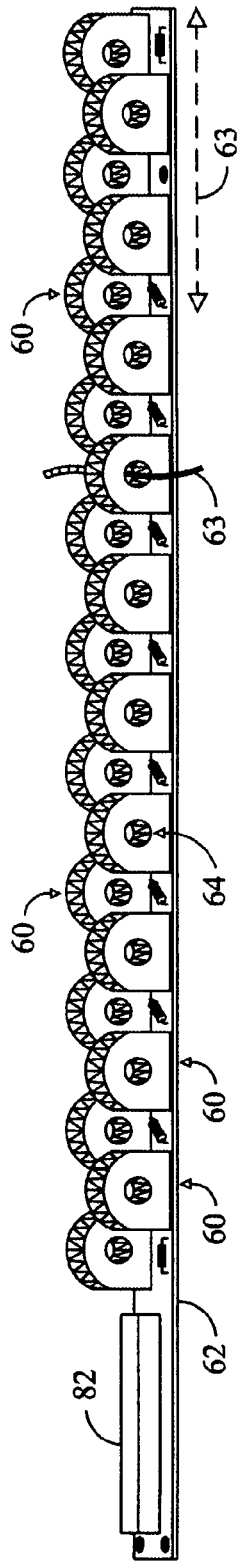
FIG. 3 illustrates a perspective view of an array of current sensors and a support.

Referring to FIG. 3, a set of current sensors 60 may be arranged on a support 62 which maintains the current sensors 60 in a fixed spatial relationship with respect to the electrical panel and one another. The current sensors 60 are preferably arranged in a spatial arrangement such that the openings 64 defined by bodies of the sensors are in a substantially directly opposing relationship with respect to the circuit breakers 16 so that the branch circuit wires may be readily routed through a respective sensor 60 for connection to a circuit breaker 16. A current sensor 60 preferably comprises wire wound around the cross-section of a metallic or non-metallic toroidal core that is enclosed within a plastic housing through which a branch circuit wire 63 may be extended. The housing at least partially surrounds the respective core. Changing current within the wire 63 induces a changing magnetic field around the wire. The changing magnetic field in turn induces a changing current within the wire that is wound around the cross-section of the toroidal core. The current induced in the wire winding may be input to the power monitor and converted to any suitable signal, such as for example, a voltage signal, or a different current signal or used directly by the power monitor to determine the current flowing in the branch circuit.

Figure 4:
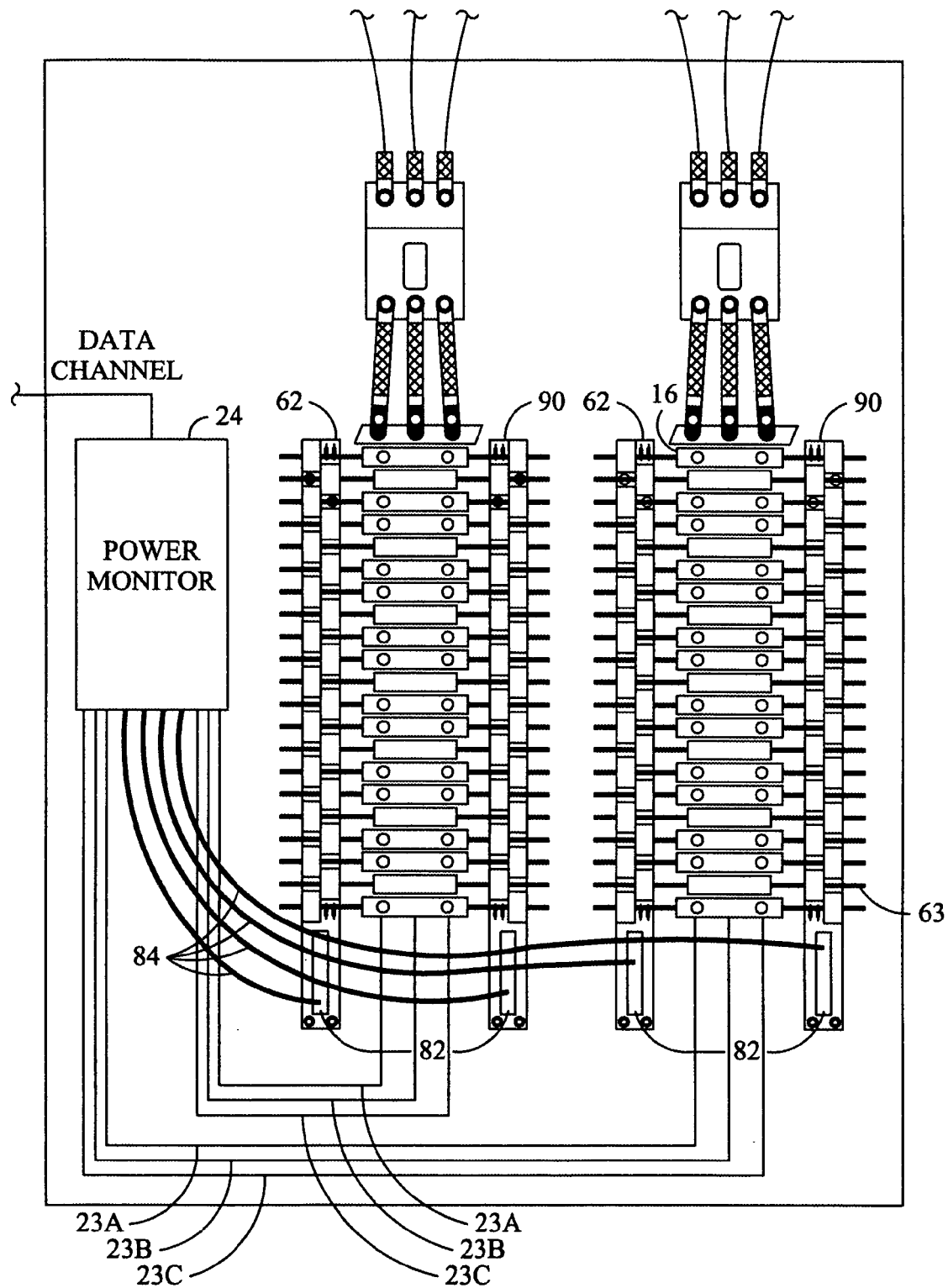
FIG. 4 illustrates a top view of the support and sensors of FIG. 3 together with circuit breakers.

Referring to FIG. 4, in a new installation, a support 62 for an array of sensors 60 is affixed within the electric panel 10 adjacent to a row of circuit breakers and the branch circuit wires 63 are routed through the openings in the respective sensors and attached to the respective circuit breakers. However, if the power monitor is to be installed in an electrical panel that is already wired, the branch circuit wires must be disconnected from the circuit breakers to permit the support 62 to be positioned adjacent to the row of circuit breakers and to permit insertion of the branch circuit wire into the central aperture 64 in the core of the sensor 60. The branch circuit wiring 63 must then be reattached to the circuit breaker 16 to complete the installation. Since an industrial electrical panel may have more than eighty circuit breakers, the installation time and expense can be significant.

A split core type current sensor is available to enable installation of a current sensor encircling a wire that remains connected during installation of the sensor. Typically, these sensors comprise a two piece, magnetically permeable, core including a U-shaped, first core portion and a hinged second core portion to close the open throat of the first portion of the core. After the wire has been introduced to the throat of the U-shaped first core portion, the second portion of the core is hinged into position to close the throat and encircle the wire with the core of the sensor. However, split core current sensors are individual units with all of the potential wiring problems of individual sensors. Moreover, split core current sensors are typically larger than one-piece current sensors exacerbating the space problems when installing a power monitor in an electrical panel enclosure. The present inventors, reflecting on the limitations of available current sensors, concluded that installation of a power monitor in a previously wired electrical panel could be facilitated with an array of compact split core current sensors arranged on a support structure that can be conveniently installed in an electrical panel adjacent to a row of circuit breakers without disconnecting the branch circuit wiring from the circuit breakers. In addition, the inventors concluded that the wiring clutter resulting from installation of a power meter in an electrical panel enclosure could be further reduced by incorporating in the sensor array a convenient connection to the bus bar(s) for voltage sensing.

Figure 5:
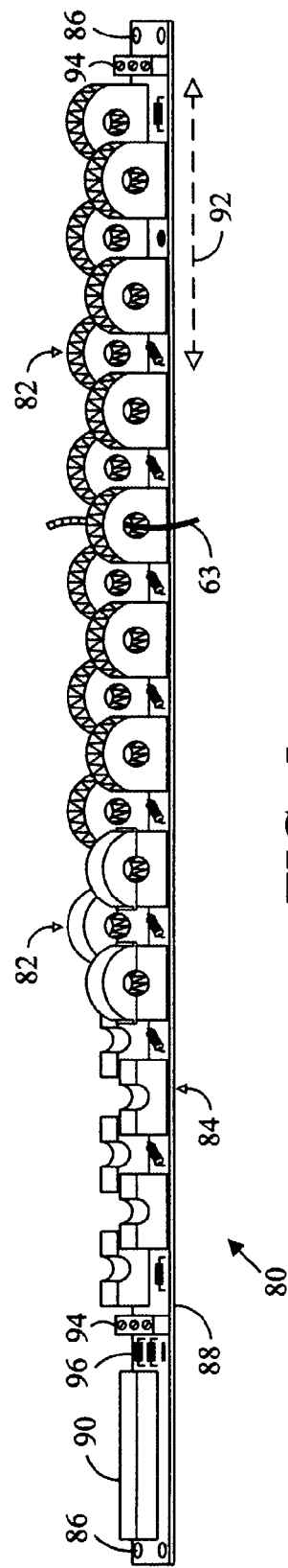
FIG. 5 illustrates a perspective view of an sensor array including split core current sensors and a support.
Figure 6:
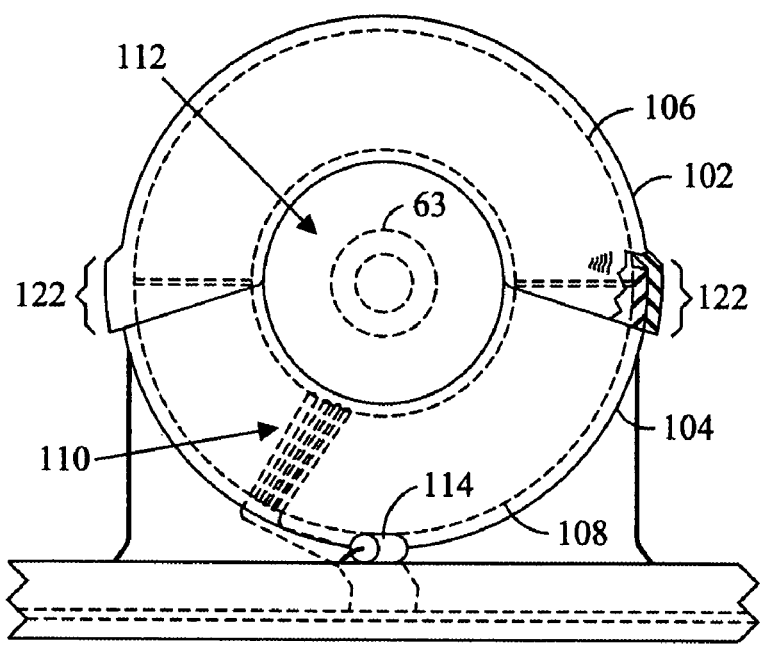
FIG. 6 illustrates an embodiment of a split core current sensor.
Figure 7:
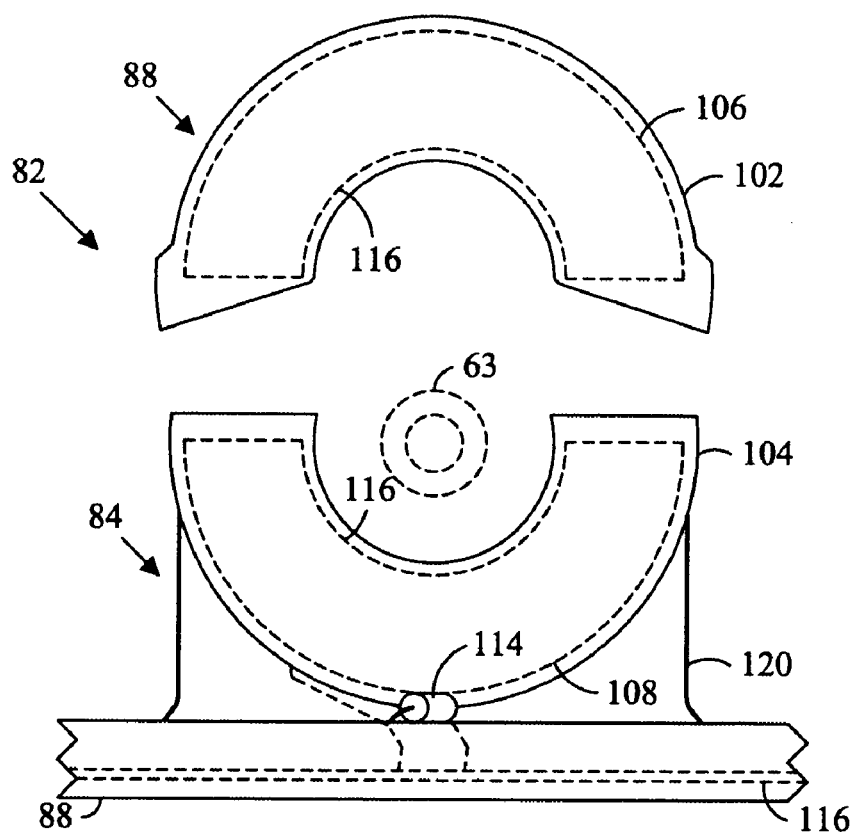
FIG. 7 illustrates the split core current sensor of FIG. 6 with the sensor segments separated.

Referring to FIG. 5, the split core sensor array 80 comprises a plurality of split core current sensors 82 arranged on a support structure 84 which maintains a fixed spatial relationship between the current sensors and between the current sensors and the electrical panel. Preferably the support structure 84 is rigid or semi-rigid, while a flexible support that was installed on a rigid or a semi-rigid supporting member(s) may likewise be used. The support structure 84 includes provision for attachment of the sensor array to an electrical panel, such as a plurality of holes for screws 86. Referring to FIGS. 6 and 7, the split core current sensors 82 comprise at least two separable sensor segments 84, 88. Each segment comprises a respective segment housing 102, 104 and a sector of a magnetically permeable toroidal core 106, 108. When the segments are joined the core will substantially encircle an electrical power conductor 63. The magnetically permeable core is constructed of sectors 106, 108 that when arranged end-to-end form, substantially, a torus. The core 106, 108 has a planar cross-section bounded by a closed curve that is typically rectangular or circular. The torus is the result of rotating the planar cross-section about an axis that lies in the plane of the cross-section but does intersect the plane of the cross-section. Each sector 106, 108 of the core includes a curved inner surface 116 which will, when the sectors are arranged end-to-end, define the central aperture 112 of the current sensor 82.

The sectors of the toroidal core 106, 108 are retained within respective separable housing segments 102, 104 that at least partially sheath the cross-sections of the respective toroidal core sectors. The housing segment 104 that encloses the core sector 98 that is wrapped with the wire winding 110 includes an extending portion 120 that terminates in a support plate 88 of the support structure 84. The housing segment 104 encloses the connections of the wire winding 110 to the conductors 116 in the support plate 84 that conduct the signals from the wire winding to the multi-conductor connector half 90 that is attached to the support plate 88.

The segment housing 102 includes a substantially tubular enlarged portion 122 (indicated by a bracket) that has an interior sufficiently large to slidably accept the ends of the second segment housing 104. Both of segment housings 102, 104 comprise annular sectors of more than 180° and the longest chord of the segment housing 104 exceeds the minimum chordal distance between the inner walls of the enlarged portions 122 on opposing sides of the segment housing 102. The housing segment 102 is typically manufactured from a thermoplastic material, such as nylon, and can elastically deform to permit the ends of the housing segment 104 to be pressed into the enlarged portion 122. Once the housing segment 104 is pressed into engagement with the enlarged portion 122 of the housing segment 102, the elastic forces in the housing urge the enlarged portion to its original size which, in conjunction with the complementary curved exterior and interior surfaces in the mating portions of the housing segments, urges the segments of the core toward each other and restrains the housing segments against disengagement. The housing segment 104 may also be manufactured from a thermoplastic material but may also be manufactured from thermosetting material to reduce deformation and increased resistance to separation.

One or more turns of wire 110 are wrapped around the cross-section of a sector 108 of the toroidal core. An alternating current in a conductor 63 routed through the central aperture 112 of the sensor 82 produces a changing magnetic field around the conductor that induces a magnetic flux in the magnetically permeable core 106, 108. The magnetic flux, in turn, induces a current in the wire windings 110 on the core 106, 108, the ends of which are attached to conductors 116 in the support plate 88.

A transient voltage suppressor 114 may be interconnected in parallel across the wire winding 110 of each sensor 80. The transient voltage suppressor 114 decreases the likelihood that a technician will be the recipient of an unanticipated electrical shock by limiting the voltage that may build up at the output of the sensor 82 if the sensor is sensing a changing magnetic field while the output terminals are open circuited.

Figure 8:
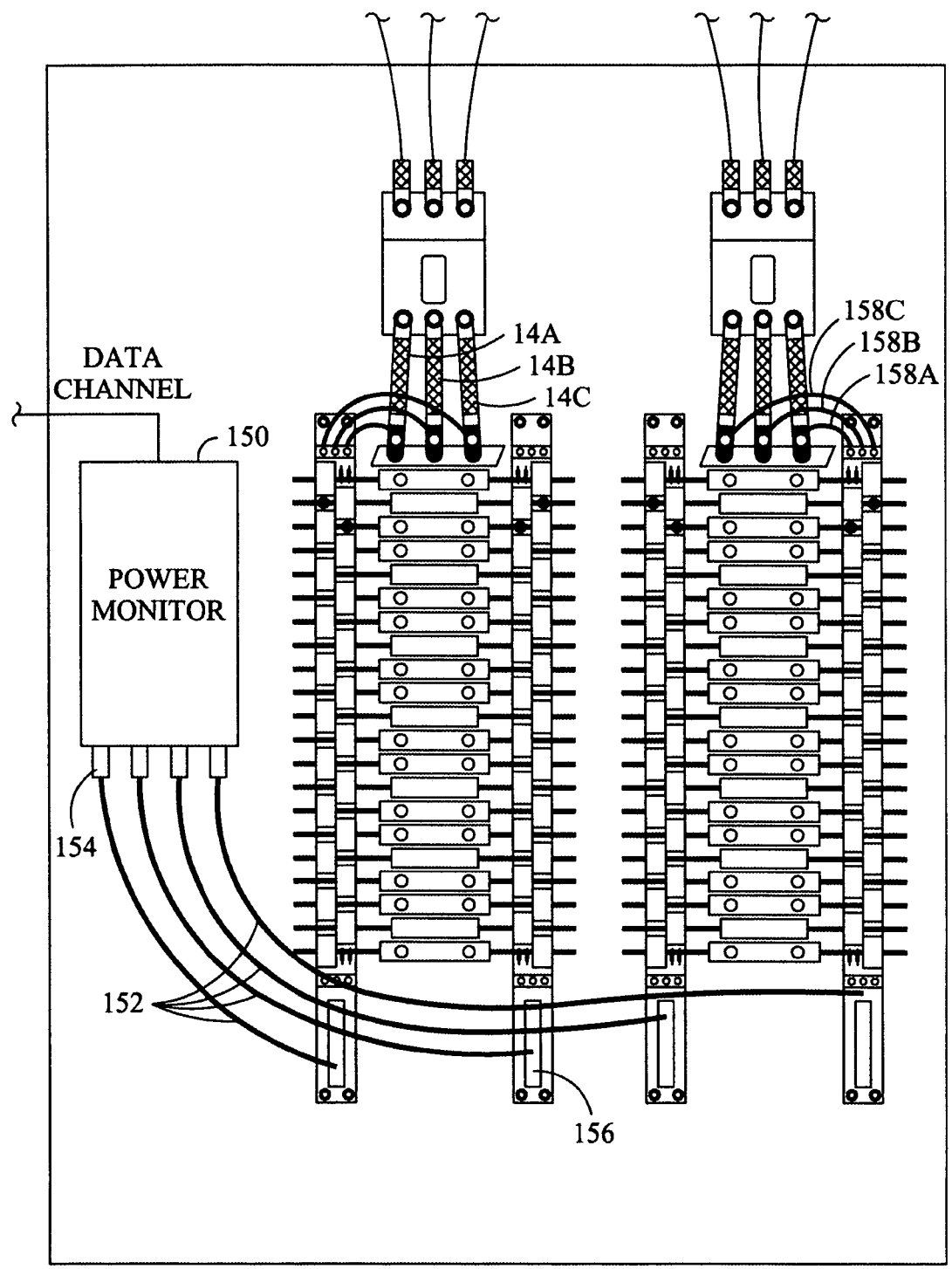
FIG. 8 illustrates a top view of an electrical panel, including circuit breakers, in which is installed a power meter including the support and sensors of FIG. 6.

Referring to FIG. 8, the ends of the wire winding 110 for each of the sensors 82 are electrically connected to a power monitor 150 through the separate conductive traces 116 in the support structure 84 and the conductors of a multi-conductor cable 152. The multi-conductor cable 152 includes multi-conductor connector halves 154, 156 at the ends to engage respective mating connector halves attached to the power monitor 150 and the support structure 84 of the sensor array 80. The conductors of the cable 152 connected to the current sensors 90 are commonly connectable to a burden resistor (not shown) that converts the current signal received from the wire winding 110 to a voltage signal representing the current flowing in the conductor. However, the current signal or any other signal useable by the power monitor 150 may be transmitted to the power monitor through the multi-conductor cable 152.

The sensor array 80 also includes at least one voltage sensor terminal block 94 that is electrically interconnected to at least one conductor 116 in the support plate 88. Typically, the terminal block 94 includes provisions for connecting three wires 158a, 158b, 158c between the three bus bars 14a, 14b, 14c and three conductors 116 in the support plate 88. The three conductors 116 in the support plate are connectable to three conductors in the multi-conductor cable 152 that connects the sensor array to the power monitor 150. Voltage dropping resistors 96 may interconnect the respective conductive traces 116 in the support plate 82 and the respective conductors in the connector half 90.

Figure 9:
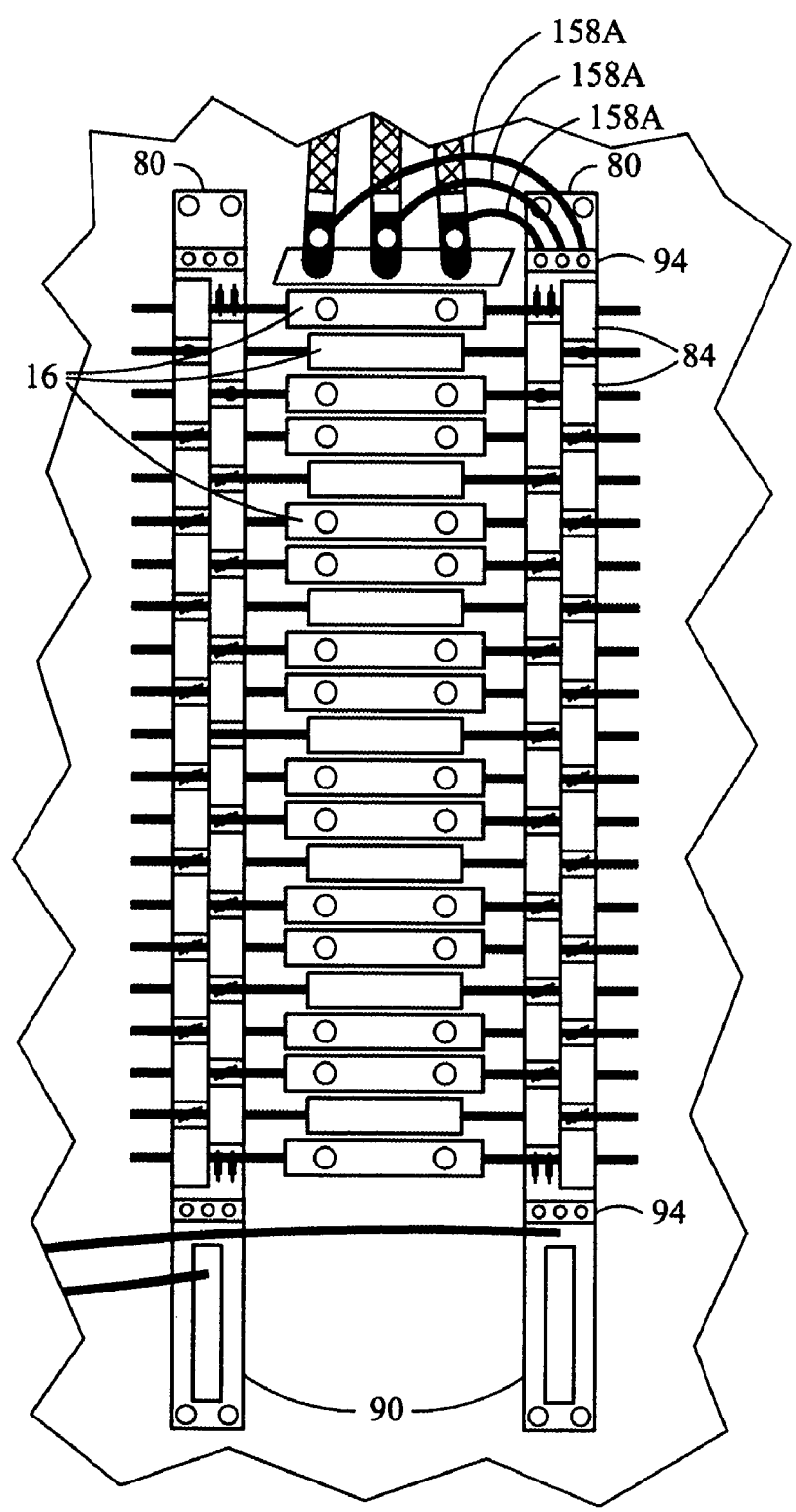
FIG. 9 is a top view of sensor arrays, without the top portions of the current sensors, installed adjacent to circuit breakers of an electrical panel.

Referring to FIG. 9, to install the sensor array 80, the upper segments 102 of the sensors 82 are removed and the sensor array is moved into position behind the branch circuit wiring 63 that is connected to the respective circuit breakers 16 of a row 20, 22 of circuit breakers. The support structure 84 is affixed to the electrical panel in an adjacent spaced apart relationship with respect to a row of circuit breakers 16. A sensor array 80 may be located on both sides of a row of circuit breakers 16, if desired. The openings 112 defined by the cores of the sensors 82 are preferably oriented in a substantially parallel relationship with respect to each other and/or oriented in a substantially perpendicular relationship with respect to the longitudinal axis 92 of the support plate 88. A single aligned set of sensors 82 may be used or two or more sets of sensors 82 may be used, as desired. However, one set of the aligned sensors having a first linear arrangement and another set of the aligned sensors having a second linear arrangement, which may be parallel to each first, provides a more compact arrangement. The current sensors 82 are preferably arranged in a spatial arrangement such that the openings 112 defined by bodies of the sensors are in a substantially directly opposing relationship with respect to the circuit breakers 16. In other words, the each of the openings 112 is opposing a respective circuit breaker 16. In this manner, the branch circuit wires may be readily aligned with the exposed semicircular portion of the central aperture 112 of a respective current sensor 82 when the upper portion 88 of the sensor is removed.

After the sensor array is attached to the panel and the branch circuit wires 63 connecting the respective loads to the respective circuit breakers 16 are aligned with the semicircular portion of a respective central aperture of a sensor 82. The upper segment 88 of the sensor 82 is positioned with the mating enlarged portion of the housing engaging the housing of the lower segment 104 and the upper segment is pushed toward the panel to engage the two segments and complete installation of the current sensor. The process is repeated for all of the sensors of the array. The wires 158a, 158b, 158c are interconnected between the bus bars 14a, 14b, 14c and the terminal block 94. The installation of the sensor array(s) 80 is complete when the multi-conductor cable 152 is connected to the sensor 80 and the power monitor 150.

Figure 10:
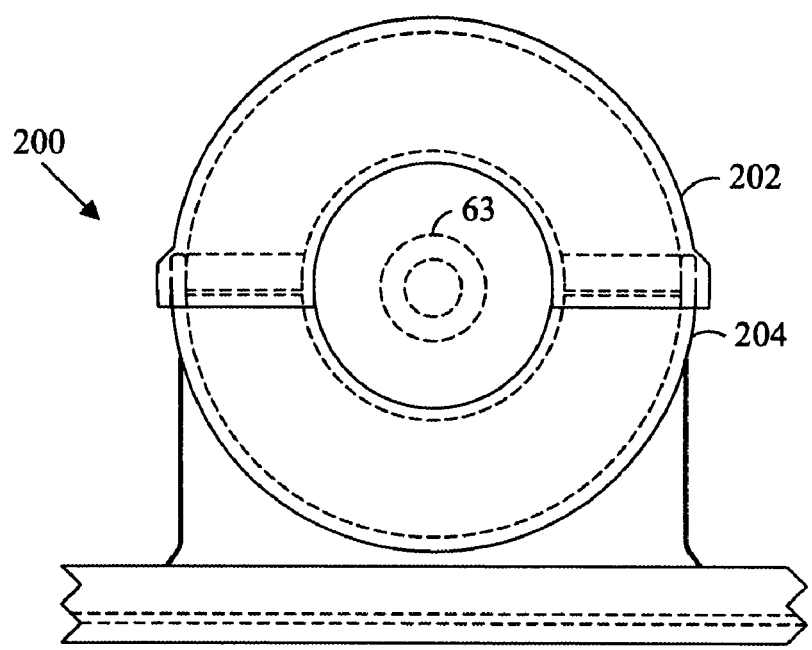
FIG. 10 illustrates a second embodiment of a split core current sensor.
Figure 11:
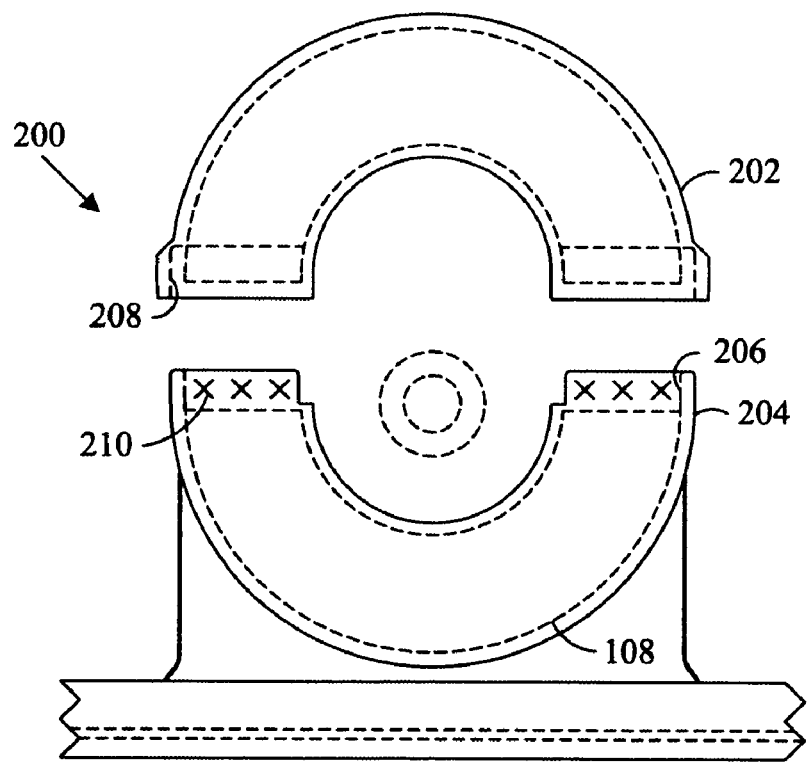
FIG. 11 illustrates the split core current sensor of FIG. 10 with the current sensor segments separated.

Referring to FIGS. 10 and 11, in another embodiment of the split core sensor array the housing of one segment 204 of the current sensor 200 includes a wall portion 206 that extends beyond the end of the transformer core segment 108. The housing of the second segment 202 includes an interior wall portion 208 that is separated from the transformer core sector 106 that is retained in the housing. With the segments 202, 204 positioned on opposing sides of a branch circuit power conductor 63, the cooperating ends of the housing segments are pressed into engagement. The projecting portion 206 of the housing of the first segment 204 is forced between the interior of the wall of the housing of the second segment 202 and the transformer core sector 106. Friction resulting from the interface of the projecting portion 206 of the housing of the first segment 204 and the transformer core sector 106, and the resilient walls of the housing of the second segment 202 prevents separation of the transformer sectors 204, 202. Friction between the mating portions 206, 208 of the transformer housing segments 204, 202 can be enhanced to restrain the engaged segments by the application of a coating of a friction enhancing substance 210, such as tacky adhesive, to the mating surfaces of one of the housing segments.

Figure 12:
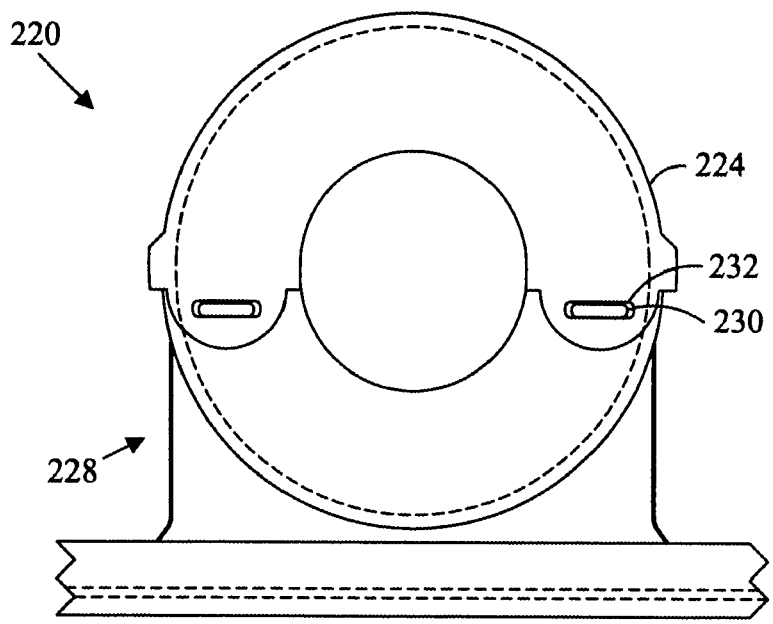
FIG. 12 illustrates a third embodiment of a split core current sensor.
Figure 13:
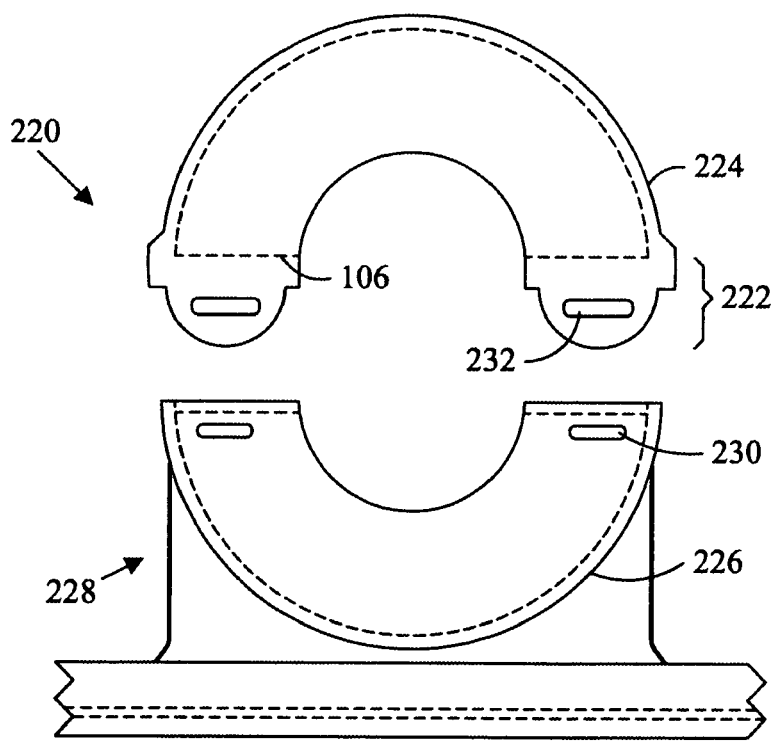
FIG. 13 illustrates the split core current sensor of FIG. 12 with the current sensor segments separated.

FIGS. 12 and 13 illustrate still another embodiment of split core current sensing 220 suitable for use in the sensor array 80. A substantially tubular projecting portion 222 (indicated by a bracket) of the walls of one of the housing segments 224 projects beyond the ends of the sector of the core 106 retained in the housing segment. The projecting portions 222 are enlarged to provide an interior sufficiently large to slidably accept in mating engagement the ends of the housing 226 of the other transformer segment 228. One of the housing segments 226 also includes a raised ridge 230 projecting from either side of the housing adjacent to the ends of the segment. Each of the raised ridges 230 is arranged to engage a corresponding aperture 232 in the wall of the mating housing segment 226 to prevent the engaged segments from separating. Similarly, a plurality complementary ridges could be formed on the approximal interior and exterior mating surfaces of the respective housing halves 224 and 226 arranged such that when the housing halves are brought into engagement and pressed together the complimentary ridges would mutually interfere to resist separation of the halves of the current sensor.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:
1. A current sensor comprising:
 (a) a first sensor segment including:
  (i) a first magnetically permeable core comprising a sector of a torus having a planar cross-section bounded by a closed curve, said planar cross-section rotated about an axis in said plane of said cross-section but not intersecting said plane of said cross-section;
  (ii) a winding including at least one turn substantially encircling said cross-section of said core; and (iii) a support arranged to retain said first magnetically permeable core in a relationship to a mounting surface;
  (iv) a first segment housing substantially enclosing said first magnetically permeable core including completely covering the sides of said core thereof;
  (v) wherein said winding encircles said core at a position between said core and said first segment housing such that said winding is not exterior to said first segment housing;
 (b) a second sensor segment including:
  (i) said second sensor segment separable from said first sensor segment, said second sensor segment including a second magnetically permeable core comprising another sector of said torus;
  (ii) said second sensor segment being joinable to said first sensor segment to restrain said first and said second cores in substantially toroidal arrangement;
  (iii) a second segment housing substantially enclosing said second magnetically permeable core including completely covering the sides of said core thereof.
2. The current sensor of claim 1 further comprising a segment housing retentively sheathing a portion of said second core, said support and said segment housing being joinable to restrain said first and said second cores in said substantially toroidal arrangement.

3. The current sensor of claim 1 further comprising:
(a) a first segment housing retentively sheathing a portion of said first core and including a protrusion; and
(b) a second segment housing retentively sheathing a portion of said second core, said second segment housing including a portion arranged to slidably receive said first segment housing and a surface arranged to engage said protrusion so as to resist separation of said first segment housing and said second segment housing.

4. The current sensor of claim 1 further comprising:
(a) a first segment housing retentively sheathing a portion of said first core; and
(b) a second segment housing retentively sheathing a portion of said second core, said second segment housing including a portion arranged to slidably receive said first segment housing between said second core and said second segment housing.

5. The current sensor of claim 1 further comprising:
(a) a first segment housing retentively sheathing a portion of said first core, said first segment housing including a first surface; and
(b) a second segment housing retentively sheathing a portion of said second core, said second segment housing including a portion arranged to slidably receive said first segment housing, said second segment housing including a second surface arranged to contact said first surface when said first segment housing is received in said second segment housing, one of said first surface and said second surface having a friction enhancing coating.

6. A sensor array comprising:
(a) a first current sensor segment including:
(i) a first magnetically permeable core comprising a sector of a torus having a planar cross-section bounded by a closed curve, said planar cross-section rotated about an axis in said plane of said cross-section but not intersecting said plane of said cross-section;
(ii) a winding including at least one turn substantially encircling said cross-section of said core;
(iii) a first segment housing retentively sheathing said first core; and
(iv) a support arranged for securing said first magnetically permeable core in a spatial relationship to a mounting surface;
(v) a first segment housing substantially enclosing said first magnetically permeable core including completely covering the sides of said core thereof
(vi) wherein said winding encircles said core at a position between said core and said first segment housing such that said winding is not exterior to said first segment housing;
(b) a second current sensor segment separable from said first current sensor segment, said second current sensor segment including:
(i) a second magnetically permeable core comprising another sector of said torus; and
(ii) a second segment housing retentively sheathing a portion of said second core, one of first segment housing and said second segment housing including a portion arranged to slidably receive the other of said first segment housing and said second segment housing in mating engagement so as to restrain said first magnetically permeable core and said second magnetically permeable core in substantially toroidal arrangement, said second segment housing substantially enclosing said second magnetically permeable core including completely covering the sides of said core thereof; and
(c) a conductor arranged in said support and connectable to a source of a voltage.

7. The sensor array of claim 6 wherein one of said first segment housing and said second segment includes a protruding portion and the other of said first segment housing and said second segment housing includes portions defining a complementary surface arranged to engage said protruding portion and resist separation of said first and said second segment housings when slidably engaged.

8. The sensor array of claim 6 wherein one of said first segment housing and said second segment housing comprises an elastic portion exerting a force on the other of said first segment housing and said second segment housing to maintain said mating engagement of said first and said second segment housings.

* * * * *